United States Patent
Yamamoto (10) Patent No.: US 11,140,778 B2
(45) Date of Patent: Oct. 5, 2021

(54) MULTILAYER CERAMIC SUBSTRATE AND METHOD OF MANUFACTURING MULTILAYER CERAMIC SUBSTRATE

(71) Applicant: Murata Manufacturing Co., Ltd., Kyoto (JP)

(72) Inventor: Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/005,419

(22) Filed: Aug. 28, 2020

(65) Prior Publication Data

US 2020/0396834 A1    Dec. 17, 2020

Related U.S. Application Data (63) Continuation of application No. PCT/JP2019/007099, filed on Feb. 25, 2019.

(30) Foreign Application Priority Data

Mar. 2, 2018  (JP) .............................. JP2018-037636

(51) Int. Cl.
  *H05K 1/11*  (2006.01)
  *H05K 1/03*  (2006.01)
  *H05K 1/02*  (2006.01)
  *H05K 3/46*  (2006.01)

(52) U.S. Cl.
  CPC ......... *H05K 1/0306* (2013.01); *H05K 1/0298* (2013.01); *H05K 1/112* (2013.01); *H05K 1/113* (2013.01); *H05K 3/4644* (2013.01); *H05K 2203/1126* (2013.01); *H05K 2203/1147* (2013.01)

(58) Field of Classification Search
  CPC .. H05K 1/0306; H05K 3/4644; H05K 1/0298; H05K 1/112; H05K 2203/1126; H05K 2203/1147; H05K 1/113; H05K 1/115
  USPC ........................................................... 174/266
  See application file for complete search history.

(56) References Cited

U.S. PATENT DOCUMENTS 3,838,204 A * 9/1974 Ahn ..................... H05K 3/4061
                                                    174/257
5,872,331 A    2/1999 Ando et al.
(Continued)

FOREIGN PATENT DOCUMENTS

| JP | H06-53652 A | 2/1994 |
| JP | H07-86867 A | 3/1995 |

(Continued)

OTHER PUBLICATIONS

JP2000-106515 English translation, Kyocera Corp (Year: 2000).*
(Continued)

*Primary Examiner* — Steven T Sawyer
(74) *Attorney, Agent, or Firm* — Pearne & Gordon LLP (57) ABSTRACT

A multilayer ceramic substrate according to the present disclosure has ceramic layers and a patterned conductor, and a cavity is formed in the multilayer ceramic substrate. The cavity reaches to any one of principal surfaces of the multilayer ceramic substrate and forms an opening, and the opening is covered with a sealing member at the principal surface of the multilayer ceramic substrate.

9 Claims, 7 Drawing Sheets

(56) References Cited

U.S. PATENT DOCUMENTS

| | | | | |
|---|---|---|---|---|
| 6,242,075 B1* | 6/2001 | Chao | ............... | H01L 21/481 |
| | | | | 156/89.11 |
| 2006/0234023 A1* | 10/2006 | Endou | ............... | H01L 23/15 |
| | | | | 428/210 |
| 2008/0245557 A1* | 10/2008 | Bird | ............... | H05K 1/113 |
| | | | | 174/262 |
| 2009/0195125 A1* | 8/2009 | Matsugi | ............... | H03H 9/1021 |
| | | | | 310/348 |
| 2011/0133847 A1* | 6/2011 | Ogura | ............... | G01C 19/5783 |
| | | | | 331/156 |
| 2016/0155713 A1* | 6/2016 | Kim | ............... | H01L 23/5383 |
| | | | | 257/659 |
| 2016/0172260 A1* | 6/2016 | Niino | ............... | H03H 9/1071 |
| | | | | 361/761 |
| 2017/0318685 A1* | 11/2017 | Chen | ............... | H05K 1/115 |
| 2017/0362079 A1 | 12/2017 | Konno et al. | | |
| 2018/0297834 A1* | 10/2018 | Renaud-Bezot | ...... | B81B 7/0064 |
| 2018/0376594 A1* | 12/2018 | Hanao | ............... | B32B 3/08 |

FOREIGN PATENT DOCUMENTS

| | | |
|---|---|---|
| JP | H11-150373 A | 6/1999 |
| JP | 2000-106515 A | 4/2000 |
| JP | 2011-182210 A | 9/2011 |
| WO | 2016/117203 A1 | 7/2016 |

OTHER PUBLICATIONS

International Search Report PCT/JP2019/007099 dated May 21, 2019.
Written Opinion for PCT/JP2019/007099 dated May 21, 2019.

* cited by examiner

MULTILAYER CERAMIC SUBSTRATE AND METHOD OF MANUFACTURING MULTILAYER CERAMIC SUBSTRATE

This is a continuation of International Application No. PCT/JP2019/007099 filed on Feb. 25, 2019 which claims priority from Japanese Patent Application No. 2018-037636 filed on Mar. 2, 2018. The contents of these applications are incorporated herein by reference in their entireties.

BACKGROUND OF THE DISCLOSURE

Field of the Disclosure

The present disclosure relates to a multilayer ceramic substrate and also to a method of manufacturing the multilayer ceramic substrate.

Description of the Related Art

Characteristics of a multilayer ceramic substrate are often improved by forming a cavity inside the multilayer ceramic substrate and thereby reducing a parasitic capacitance generated between wiring conductors.

Patent Document 1 discloses a multilayer ceramic substrate in which wiring conductors are formed three-dimensionally and cavities are formed only near wiring conductors of inner layers.

Patent Document 2 discloses a multilayer circuit substrate that is a multilayer body formed by laminating multiple dielectric substrates. The multilayer body includes functional elements. In the multilayer circuit substrate, cavities are formed at the respective upper surfaces of the functional elements.

Patent Document 1: Japanese Unexamined Patent Application Publication No. 6-53652

Patent Document 2: Japanese Unexamined Patent Application Publication No. 11-150373

BRIEF SUMMARY OF THE DISCLOSURE

Patent Document 1 discloses the multilayer ceramic substrate in which cavities are formed. The cavities of Patent Document 1 are formed by patterning a photosensitive resin on a substrate and by subsequent firing. In this process, however, a gas generated during firing does not escape, which may lead to firing defects.

Patent Document 2 discloses the multilayer circuit substrate in which cavities communicate with the atmosphere through vent holes. It describes that the cavities configured to communicate with the atmosphere through vent holes can prevent an increase in the internal pressure caused by expansion of the air in each cavity during green sheet firing.

However, this may lead to a problem that if the cavities communicate with the atmosphere through the vent holes, moisture and dust may enter the cavities through the vent holes. If moisture enters the substrate through the vent holes, the moisture condenses inside the substrate, which may affect characteristic values of the substrate.

In addition, when the multilayer ceramic substrate is covered with a resin mold after electronic components are mounted on the multilayer ceramic substrate, the resin used for the mold may enter the cavities through the vent holes.

The present disclosure is made to solve the above problems, and an object of the present disclosure is to provide a reliable multilayer ceramic substrate that can suppress the parasitic capacitance by forming cavities inside the substrate and that is not affected easily by the external environment, such as moisture.

Another object of the present disclosure is to provide a method of manufacturing the above multilayer ceramic substrate.

The present disclosure provides a multilayer ceramic substrate that has ceramic layers and a patterned conductor, and a cavity is formed in the multilayer ceramic substrate. The cavity reaches to a principal surface of the multilayer ceramic substrate and forms an opening, and the opening is covered with a sealing member at the principal surface of the multilayer ceramic substrate.

In the multilayer ceramic substrate according to the present disclosure, a land is preferably formed at a position around the opening, and solder that serves as the sealing member is preferably disposed on the land.

In the multilayer ceramic substrate according to the present disclosure, the land is preferably disposed so as to surround the entire circumference of the opening.

In the multilayer ceramic substrate according to the present disclosure, the land is preferably a surface portion of a via conductor formed inside a ceramic layer that serves for the principal surface of the multilayer ceramic substrate, and the solder is preferably present on an inside wall of the via conductor.

In the multilayer ceramic substrate according to the present disclosure, an outside diameter of the land is preferably larger by 50 µm or more than an outside diameter of the opening.

In the multilayer ceramic substrate according to the present disclosure, the cavity is preferably formed of a lateral cavity that stretches inside the multilayer ceramic substrate in a direction parallel to the principal surface of the multilayer ceramic substrate and also of a communication hole that extends from the lateral cavity toward the principal surface of the multilayer ceramic substrate so as to reach to the principal surface.

In the multilayer ceramic substrate according to the present disclosure, the cavity is preferably positioned between the patterned conductors that oppose each other.

In the multilayer ceramic substrate according to the present disclosure, the outside diameter of the opening is preferably 20 µm or more and 200 µm or less.

In the multilayer ceramic substrate according to the present disclosure, the principal surface of the multilayer ceramic substrate to which the cavity reaches is preferably covered with a resin mold.

A method of manufacturing a multilayer ceramic substrate according to the present disclosure includes a step of forming a hole for forming a cavity in a ceramic green sheet that contains an unsintered ceramic material, a step of filling the hole with a cavity forming material, a step of forming a patterned conductor on the ceramic green sheet, a laminating step of laminating the ceramic green sheets to obtain a multilayer body in such a manner that the cavity forming material in the ceramic green sheets continues in the thickness direction so as to reach to a principal surface of the multilayer body, a firing step of firing the multilayer body in such a manner that the unsintered ceramic material is sintered and the cavity forming material is burnt out to form a cavity that reaches to the principal surface of the multilayer ceramic substrate, and a sealing step of sealing an opening of the cavity that reaches to the principal surface of the multilayer ceramic substrate by covering the opening with a sealing member.

In the method of manufacturing the multilayer ceramic substrate according to the present disclosure, the cavity is preferably covered with the sealing member in the following manner: in the step of forming the patterned conductor on the ceramic green sheet, a land is formed around a portion filled with the cavity forming material on a ceramic green sheet that serves for the principal surface of the multilayer body, and in the sealing step, solder that serves as the sealing member is disposed on the land.

In the method of manufacturing the multilayer ceramic substrate according to the present disclosure, the cavity is preferably covered with the sealing member in the following manner. First, in the step of forming the hole for forming the cavity in the ceramic green sheet, a larger diameter hole having a diameter larger than that of the cavity to be formed for the multilayer ceramic substrate is formed in the ceramic green sheet that serves for the principal surface of the multilayer body, and the larger diameter hole is subsequently filled with a via conductor. Second, a same diameter hole having the same diameter as that of the cavity to be formed for the multilayer ceramic substrate is formed in a center portion of the via conductor that has been filled in the larger diameter hole, and the same diameter hole is subsequently filled with the cavity forming material. Third, after the firing step, a surface of the via conductor filled in the large diameter hole becomes the land of a ceramic layer that serves for the principal surface of the multilayer ceramic substrate, and the cavity is surrounded by the via conductor. Finally, in the sealing step, solder that serves as the sealing member is disposed on the land.

In the method of manufacturing the multilayer ceramic substrate according to the present disclosure, a lateral cavity that stretches in a direction parallel to the principal surface of the multilayer ceramic substrate is preferably formed inside the multilayer ceramic substrate in the following manner: in the step of forming the hole for forming the cavity in the ceramic green sheet, holes are formed contiguously in a single ceramic green sheet in such a manner that the holes partially overlap each other and a center of a hole is shifted from a center of a previous hole, and the holes are filled with the cavity forming material, and in the firing step, the cavity forming material is burnt out.

In the method of manufacturing the multilayer ceramic substrate according to the present disclosure, the lateral cavity that stretches in a direction parallel to the principal surface of the multilayer ceramic substrate is preferably formed inside the multilayer ceramic substrate in the following manner: in the step of forming the hole for forming the cavity in the ceramic green sheet, a laterally expanded hole is formed in a single ceramic green sheet and a cavity forming sheet is disposed at the laterally expanded hole, and in the firing step, the cavity forming sheet is burnt out.

The method of manufacturing the multilayer ceramic substrate according to the present disclosure preferably includes a step of covering the principal surface of the multilayer ceramic substrate to which the cavity reaches with a resin mold.

The present disclosure can provide a reliable multilayer ceramic substrate that can suppress the parasitic capacitance by forming cavities inside the substrate and that is not affected easily by the external environment, such as moisture.

DETAILED DESCRIPTION OF THE
DISCLOSURE

A multilayer ceramic substrate and a method of manufacturing the multilayer ceramic substrate according to the present disclosure will be described.

The present disclosure, however, is not limited to configurations described herein but can be applied in an appropriately modified manner insofar as such a modification does not depart from the gist of the present disclosure. Note that any combinations obtained by combining two or more preferable configurations of the present disclosure described herein fall within the scope of the present disclosure.

Figure 1:
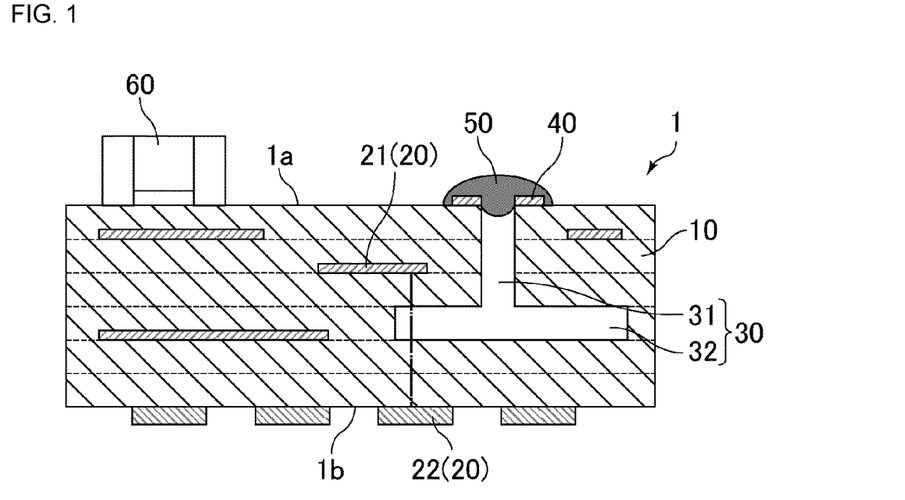
FIG. 1 is a cross-sectional view schematically illustrating an example of a multilayer ceramic substrate according to a first embodiment of the present disclosure.

FIG. 1 is a cross-sectional view schematically illustrating an example of a multilayer ceramic substrate according to a first embodiment of the present disclosure.

A multilayer ceramic substrate 1 illustrated in FIG. 1 is formed by laminating multiple ceramic layers 10 and has a principal surface 1a on which an electronic component 60 is mounted and a principal surface 1b that is opposite to the principal surface 1a.

The multilayer ceramic substrate 1 has a cavity 30 that is constituted by a lateral cavity 32 and a communication hole 31. The lateral cavity 32 stretches inside the multilayer ceramic substrate 1 in a direction parallel to the principal surfaces thereof. The communication hole 31 extends from the lateral cavity 32 to the principal surface 1a. The communication hole 31, which is part of the cavity 30, reaches to the principal surface 1a of the multilayer ceramic substrate 1 and forms an opening.

Note that in the multilayer ceramic substrate 1 illustrated in FIG. 1, a single communication hole 31 extends from the lateral cavity 32 and reaches to the principal surface 1a of the multilayer ceramic substrate 1 and forms the opening. In the multilayer ceramic substrate according to the present disclosure, however, a single lateral cavity may be provided with multiple communication holes extending therefrom.

Moreover, the multilayer ceramic substrate according to the present disclosure may have multiple cavities at different locations.

Ceramics for forming the ceramic layers 10 preferably contain a low-temperature-sintering ceramic material.

The low-temperature-sintering ceramic material is a ceramic material that can be sintered at a firing temperature of 1000° C. or less and can be fired simultaneously with, for example, copper or silver.

Examples of the low-temperature-sintering ceramic material may include a glass-composite-based low-temperature-sintering ceramic material made, for example, by mixing borosilicate glass with a ceramic material, such as quartz, alumina, or forsterite, and a crystallized-glass-based low-temperature-sintering ceramic material using a crystallized glass based on $ZnO—MgO—Al_2O_3—SiO_2$, and a nonglass low-temperature-sintering ceramic material using a ceramic material based, for example, on $BaO—Al_2O_3—SiO_2$ or on $Al_2O_3—CaO—SiO_2—MgO—B_2O_3$.

The multilayer ceramic substrate 1 includes patterned conductors 20 formed therein.

Examples of the patterned conductors 20 are signal lines 21 formed inside the multilayer ceramic substrate 1 and grounds 22 formed on the principal surface 1b of the multilayer ceramic substrate 1.

The type of the patterned conductors may include any type of conductor that can be formed in the multilayer ceramic substrate, for example, a coil, a signal line, or a ground.

The patterned conductors are preferably made of copper, silver, gold, palladium, or alloys of these and are preferably made of a material that can be co-fired with the low-temperature-sintering ceramic material of which the ceramic layer is preferably made.

The patterned conductors and cavities are preferably arranged such that a cavity is positioned between mutually opposing patterned conductors. The cavity is filled with air that has a relative dielectric constant smaller than that of the material of the ceramic layer, which can thereby reduce the parasitic capacitance generated between mutually opposing patterned conductors. Signal lines (strip lines) or coils are the patterned conductors for which provision of a cavity is advantageous to reduce the parasitic capacitance. In FIG. 1, the dash-dot line indicates that a signal line 21 and a ground 22 are the mutually opposing patterned conductors. The dash-dot line crosses the lateral cavity 32, which means that the cavity is positioned between the mutually opposing patterned conductors.

The cavity 30 is covered with a sealing member 50 at the principal surface 1a of the multilayer ceramic substrate 1. In other words, the cavity 30 reaches to the principal surface 1a of the multilayer ceramic substrate 1 and forms an opening, and the opening is covered with the sealing member 50. Since the cavity 30 does not communicate with the atmosphere at the principal surface 1a of the multilayer ceramic substrate, moisture and dust are prevented from entering the cavity 30. Moreover, when the resin mold is formed to cover the principal surface 1a of the multilayer ceramic substrate 1, the resin mold is also prevented from entering the cavity 30.

In the configuration according to the present embodiment in which the opening is covered with the sealing member, the opening can be closed reliably compared with a configuration in which the opening is closed entirely by using another ceramic layer. Moreover, manufacturing is easier with this configuration.

The multilayer ceramic substrate configured as above is a reliable multilayer ceramic substrate in which the parasitic capacitance is suppressed due to the presence of cavities and that is not affected easily by the external environment, such as moisture.

Note that in the multilayer ceramic substrate according to the present disclosure, it is sufficient that the cavity reaches to any one of principal surfaces of the multilayer ceramic substrate and the sealing member seals the opening at the principal surface to which the cavity reaches. In other words, in the multilayer ceramic substrate, the cavity may reach to, and form an opening at, the principal surface that is opposite to the principal surface on which the electronic component is mounted (i.e., the principal surface 1b of the multilayer ceramic substrate 1 of FIG. 1) insofar as the opening is covered with the sealing member.

The sealing member 50 is disposed on a land 40 that is formed around the cavity 30 at the principal surface 1a of the multilayer ceramic substrate 1.

Solder is preferably used as the material of the sealing member 50.

In the case of solder being used as the sealing member disposed on the land, the solder can be disposed by printing and can spread over the land, which provides reliable sealing performance.

Instead of using solder, the sealing member may be a bonding material that can form an intermetallic compound by heating or may be a resin material.

In the case of a resin material being used as the sealing member, the land is not necessarily formed. Moreover, in the case of the resin material, the member may have a cross-sectional shape of a rivet. In this case, the shaft of the rivet enters the cavity, while the head covers the cavity.

An electronic component can be mounted on the multilayer ceramic substrate according to the present disclosure. The type of electronic component to be mounted is not specifically limited here but may be, for example, an LNA (low-noise amp), a RF-IC, a BB-IC, and an SMD passive component.

Figure 2A:
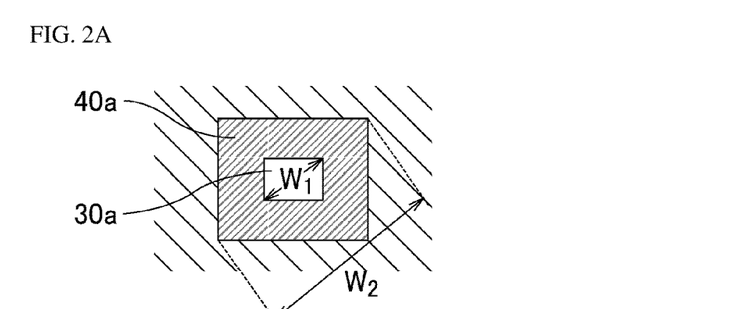
FIG. 2A, FIG. 2B, and FIG. 2C are top views schematically illustrating examples of positional relationship between a cavity and a land.
Figure 2B:
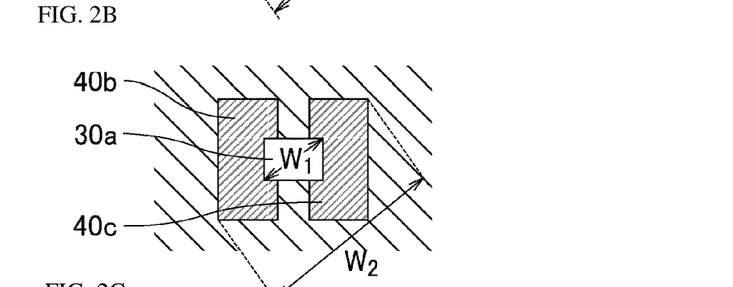
Figure 2C:
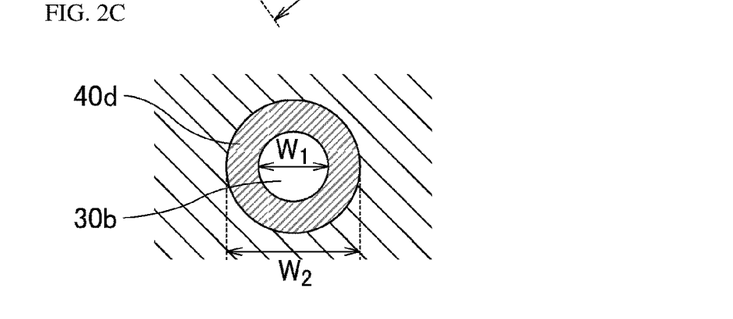

FIG. 2A, FIG. 2B, and FIG. 2C are top views schematically illustrating examples of positional relationship between a cavity and a land.

The cavity and the land illustrated in FIG. 2A, FIG. 2B, and FIG. 2C are examples that can be disposed at a principal surface of the multilayer ceramic substrate according to the present disclosure. Note that the sealing member to be disposed on each land is not illustrated in these figures.

It is preferable that the land formed on the multilayer ceramic substrate be formed so as to surround the entire circumference of the cavity.

In FIG. 2A, a land 40a is formed around the entire circumference of the cavity 30a that is shaped like a rectangle as viewed from above. In FIG. 2C, a land 40d is formed around the entire circumference of the cavity 30b that is shaped like a circle as viewed from above.

In the case of the land being formed around the entire circumference, the solder serving as the sealing member spreads over the entire circumference of the cavity when applied by using a printing technique, which enables the solder to seal the cavity reliably.

FIG. 2B illustrates an example in which a land 40b and a land 40c are disposed in a separate manner instead of disposing a land that surrounds the entire circumference of the cavity 30a. Also, with this land configuration, the solder as the sealing member can be applied onto the land by printing and can thereby seal the cavity.

The shapes of the cavity and the land as viewed from above are not specifically limited. As an example, however, these shapes may be rectangular as illustrated in FIGS. 2A and 2B, circular as illustrated in FIG. 2C, polygonal other than rectangular, or may be oval.

In addition, the outside diameter of the land is preferably larger by 50 μm or more than the outside diameter of the opening.

The outside diameter of the opening is indicated by the double-pointed arrow W1 in each of FIGS. 2A, 2B, and 2C, which is defined as a maximum diameter of the cavity as viewed from above.

The outside diameter of the land is indicated by the double-pointed arrow W2 in each of FIGS. 2A, 2B, and 2C, which is defined as a maximum diameter of the land as viewed from above with the opening included therein.

The outside diameter of the land as defined as above (W2) is preferably larger by 50 μm or more than the outside diameter of the opening (W1). If the outside diameter of the land and the outside diameter of the opening satisfy the above relationship, the opening is sealed more reliably when the solder as the sealing member is applied onto the land by printing.

In addition, the outside diameter of the opening is preferably 20 μm or more and 200 μm or less.

If the outside diameter of the opening is less than 20 μm, a gas generated in a firing step becomes difficult to escape from the cavity. If the outside diameter of the opening exceeds 200 μm, it becomes difficult to seal the cavity with the sealing member, and a large quantity of the sealing member may enter the cavity.

Figure 3:
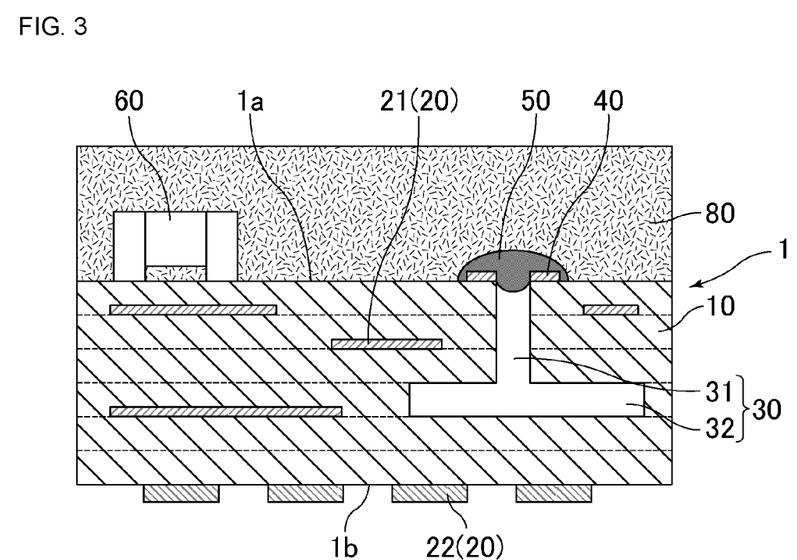
FIG. 3 is a cross-sectional view schematically illustrating an example of the multilayer ceramic substrate of FIG. 1, in which a principal surface is covered with a resin mold.

FIG. 3 is a cross-sectional view schematically illustrating an example of the multilayer ceramic substrate of FIG. 1, in which a principal surface thereof is covered with a resin mold.

In FIG. 3, the principal surface 1a of the multilayer ceramic substrate 1 is covered with a resin mold 80.

The cavity 30 is covered with a sealing member 50 at the principal surface 1a, which prevents the resin mold 80 from entering the cavity 30.

Next, a multilayer ceramic substrate according to a second embodiment of the present disclosure will be described.

The multilayer ceramic substrate according to the second embodiment of the present disclosure is different from the multilayer ceramic substrate according to the first embodiment in that the land formed around the cavity has a different configuration.

Figure 4:
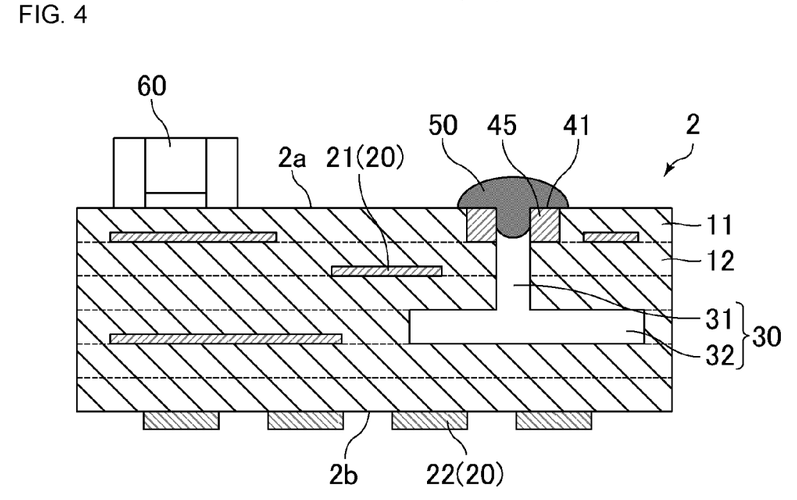
FIG. 4 is a cross-sectional view schematically illustrating an example of a multilayer ceramic substrate according to a second embodiment of the present disclosure.

FIG. 4 is a cross-sectional view schematically illustrating an example of the multilayer ceramic substrate according to the second embodiment of the present disclosure.

The multilayer ceramic substrate 2 illustrated in FIG. 4 has a principal surface 2a on which the electronic component 60 is mounted and a principal surface 2b that is opposite to the principal surface 2a.

In the multilayer ceramic substrate 2, a land 41 is a surface portion of a via conductor 45 formed inside a ceramic layer 11. The ceramic layer 11 is a layer that serves for the principal surface 2a of the multilayer ceramic substrate 2.

Also, in this case, the cavity 30 is covered with a sealing member 50 at the principal surface 2a of the multilayer ceramic substrate 2. Accordingly, covering the cavity with the sealing member can provide the same advantageous effects as those of the multilayer ceramic substrate 1 according to the first embodiment.

In the multilayer ceramic substrate 2, the inside wall of the cavity 30 in the ceramic layer 11 is the inside wall of the via conductor 45. In the multilayer ceramic substrate 2, the sealing member 50 is also present on the inside wall of the via conductor 45.

In the case of the solder being used as the sealing member 50, the solder spreads also on the inside wall of the via conductor 45, which causes the sealing member 50 to stay on the inside wall of the via conductor 45. The sealing performance of the cavity can be thereby improved.

Note that in FIG. 4, the ceramic layer that forms the principal surface 2a of the multilayer ceramic substrate 2 is denoted by reference sign 11 to distinguish the ceramic layer 11 from other ceramic layers 12.

Next, a multilayer ceramic substrate according to a third embodiment of the present disclosure will be described.

In the multilayer ceramic substrate according to the third embodiment of the present disclosure, the configuration of the cavity is different from that of the multilayer ceramic substrate according to the first embodiment.

Figure 5:
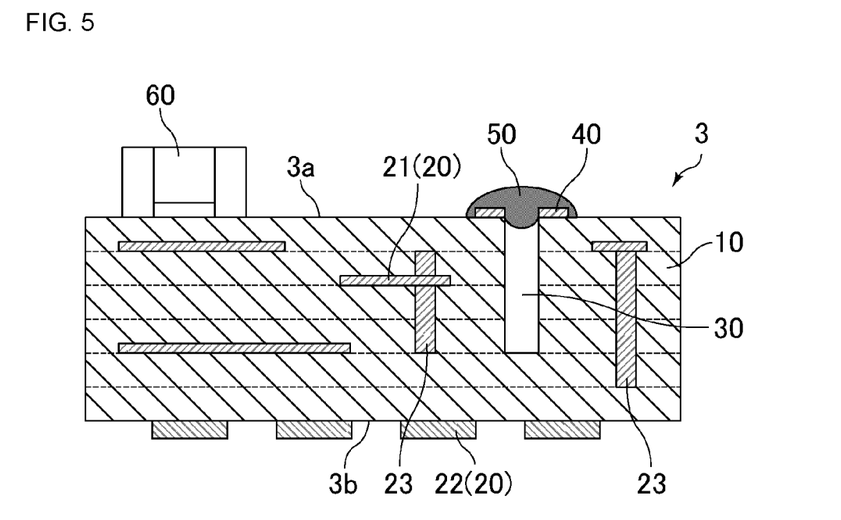
FIG. 5 is a cross-sectional view schematically illustrating an example of a multilayer ceramic substrate according to a third embodiment of the present disclosure.

FIG. 5 is a cross-sectional view schematically illustrating an example of the multilayer ceramic substrate according to the third embodiment of the present disclosure.

The multilayer ceramic substrate 3 illustrated in FIG. 5 has a principal surface 3a on which the electronic component 60 is mounted and a principal surface 3b that is opposite to the principal surface 3a.

In the multilayer ceramic substrate 3, the cavity 30 does not have a lateral cavity that stretches in a direction parallel to the principal surfaces thereof, and the cavity 30 only has a communication hole that extends so as to reach to a principal surface of the multilayer ceramic substrate.

Also, in this case, the cavity 30 is covered with the sealing member 50 at the principal surface 3a of the multilayer ceramic substrate 3. Accordingly, covering the cavity with the sealing member can provide the same advantageous effect as that of the multilayer ceramic substrate 1 according to the first embodiment.

As illustrated in FIG. 5, the cavity 30 configured as described above is positioned between patterned conductors (vias) 23 that oppose each other in a direction orthogonally intersecting with the thickness direction, which can thereby reduce the parasitic capacitance generated between the opposing patterned conductors 23.

Next, a method of manufacturing the multilayer ceramic substrate according to the present disclosure will be described.

The method of manufacturing the multilayer ceramic substrate according to the present disclosure is characterized in that a cavity is formed so as to reach to a principal surface of the multilayer ceramic substrate and the cavity is sealed with a sealing member. Accordingly, the following description will focus on these points.

In addition, the method of manufacturing the multilayer ceramic substrate according to the present disclosure will be described by taking a case of manufacturing the multilayer ceramic substrate according to the first embodiment as an example.

First of all, various types of ceramic green sheets to be used to form the cavity in the multilayer ceramic substrate are prepared.

A lateral-cavity forming green sheet is prepared to form the lateral cavity that stretches in a direction parallel to the principal surfaces of the multilayer ceramic substrate.

It is preferable that the lateral-cavity forming green sheet be prepared in such a manner that holes for forming the cavity are made side by side in a single ceramic green sheet and a cavity forming material is subsequently filled into the holes for forming the cavity.

Figure 6A:
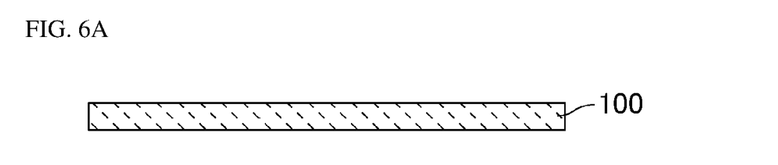
FIG. 6A, FIG. 6B, and FIG. 6C are process drawings schematically illustrating an example process of preparing a lateral-cavity forming green sheet.
Figure 6B:
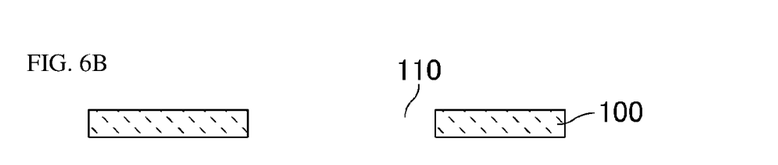
Figure 6C:
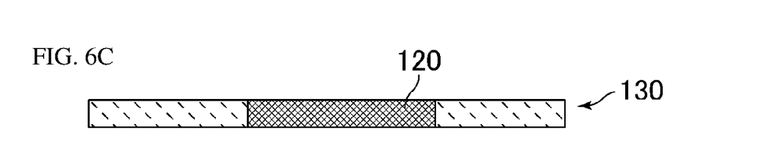

FIGS. 6A, 6B, and 6C are process drawings schematically illustrating an example process of preparing the lateral-cavity forming green sheet.

FIG. 6A illustrates a ceramic green sheet 100. The ceramic green sheet is a green sheet that contains an unsintered ceramic material.

In the preparation of the ceramic green sheet, a slurry is prepared first by mixing appropriate amounts of a ceramic powder, a binder, and a plasticizer, and subsequently the slurry is applied onto a carrier film.

For example, the slurry can be applied to the film using a lip coater or a doctor blade.

The thickness of a ceramic green sheet is not specifically limited. As an example, however, the thickness of the ceramic green sheet is preferably 5 µm or more and 100 µm or less.

The ceramic powder is preferably powder of the low-temperature-sintering ceramic material described above.

A via (not illustrated) may be provided in the ceramic green sheet to serve as a conductor in the thickness direction. The via is formed by making a via hole that extends in the thickness direction and by filling the via hole with an electroconductive paste.

The via hole can be made, for example, by punching or by using a $CO_2$ laser or a UV laser. The diameter of the via hole is preferably 20 µm or more and 200 µm or less.

The electroconductive paste to be filled in the via hole may be a paste containing an electroconductive powder, a plasticizer, and a binder. The material of the ceramic green sheet (ceramic powder) may be added to the electroconductive paste to adjust the degree of shrinkage.

FIG. 6B illustrates a state of the ceramic green sheet 100 in which a cavity forming hole 110 is made. In order to form a lateral cavity having a predetermined size, holes each having a size smaller than the cavity forming hole 110 are formed contiguously in the ceramic green sheet 100 in such a manner that the center of a new hole is shifted slightly from the center of a previous hole while the new hole partially overlaps the previous hole.

The holes can be made, for example, by punching or by using a $CO_2$ laser or a UV laser. The diameter of each hole is preferably 20 µm or more and 200 µm or less.

FIG. 6C illustrates a lateral-cavity forming green sheet 130 prepared by filling the cavity forming hole 110 with a cavity forming material 120.

It is preferable that the cavity forming material be a material that can be burnt out later in a firing step at the firing temperature or lower (preferably at 800° C. or more and 1000° C. or less) and more specifically a material that can be burnt out at a temperature of 850° C. or more and 950° C. or less.

The cavity forming material can be a resin paste composed of a resin, a plasticizer, and a binder, or can be a carbon paste composed of carbon, a plasticizer, and a binder.

Subsequently, to form the patterned conductors, the conductive paste is applied, by printing, onto the surface of the lateral-cavity forming green sheet 130 at predetermined positions (illustration is omitted).

The conductive paste may be a paste containing an electroconductive powder, a plasticizer, and a binder. The patterned conductors can be printed, for example, by screen printing, ink jet printing, or gravure printing.

Communication-hole forming green sheets are separately prepared to form a communication hole that extends to a principal surface of the multilayer ceramic substrate.

Each communication-hole forming green sheet is prepared by making a cavity forming hole having the same diameter as that of the communication hole in a ceramic green sheet and by filling the hole with the cavity forming material.

Multiple communication-hole forming green sheets are prepared in such a manner that the holes are preferably aligned with each other so as to form a single hole when the communication-hole forming green sheets are laminated.

Figure 7A:
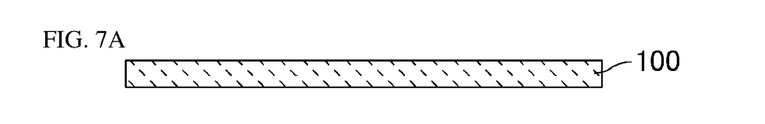
FIG. 7A, FIG. 7B, and FIG. 7C are process drawings schematically illustrating an example process of preparing a communication-hole forming green sheet.
Figure 7B:
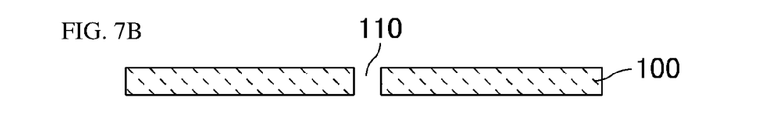
Figure 7C:
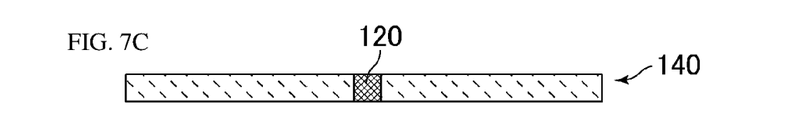
Figure 7D:
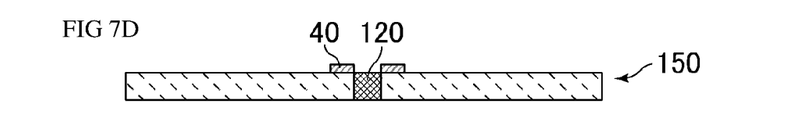
FIG. 7D is a cross-sectional view schematically illustrating an example of a principal-surface forming green sheet that is a type of communication-hole forming green sheet and is disposed on a principal surface of a multilayer body.

FIGS. 7A, 7B, and 7C are process drawings schematically illustrating an example process of preparing a communication-hole forming green sheet. FIG. 7D is a cross-sectional view schematically illustrating an example of a principal-surface forming green sheet that is one type of the communication-hole forming green sheet to be disposed to serve for a principal surface of a multilayer body.

FIG. 7A illustrates a ceramic green sheet 100. This sheet can be the same as the ceramic green sheet 100 of FIG. 6A.

A via may be formed in the ceramic green sheet 100 to serve as a conductor in the thickness direction.

FIG. 7B illustrates a state of the ceramic green sheet 100 in which the cavity forming hole 110 is formed. A single cavity forming hole 110 having the same diameter as that of the communication hole to be formed can be made for each communication hole.

The cavity forming hole can be made, for example, by punching or by using a $CO_2$ laser or a UV laser. The diameter of the cavity forming hole is preferably 20 µm or more and 200 µm or less.

FIG. 7D illustrates a communication-hole forming green sheet 140 obtained after the cavity forming hole 110 is filled with the cavity forming material 120.

The cavity forming material can be the same as the material used in the preparation of the lateral-cavity forming green sheet 130.

The communication-hole forming green sheets are obtained in the above step. A land is formed around a portion filled with the cavity forming material on the principal-surface forming green sheet, which is a type of communication-hole forming green sheet to be disposed as the principal surface of the multilayer body.

FIG. 7D illustrates a principal-surface forming green sheet 150 on which a land 40 is formed around the portion filled with the cavity forming material 120. The land 40 can be formed by applying the conductive paste by printing.

The land 40 may be printed using the conductive paste on the surface of the principal-surface forming green sheet 150 simultaneously with the patterned conductor printing.

The conductive paste is also applied by printing to form the patterned conductors at predetermined positions on the surface of the communication-hole forming green sheet 140.

Subsequently, a laminating step is carried out to produce a multilayer body by laminating various types of ceramic green sheets obtained in the above step.

In the laminating step, the ceramic green sheets are stacked in such a manner that the cavity forming material in the ceramic green sheets continues in the thickness direction so as to reach to a principal surface of the multilayer body.

The number of ceramic green sheets to be stacked can be determined appropriately to meet the design thickness of a product.

The multilayer body is subsequently placed in a die and subjected to press bonding. The pressure and the temperature can be set appropriately.

FIGS. 8A, 8B, 8C, and 8D are process drawings schematically illustrating example steps to be carried out after the laminating step in the method of manufacturing the multilayer ceramic substrate.

Figure 8A:
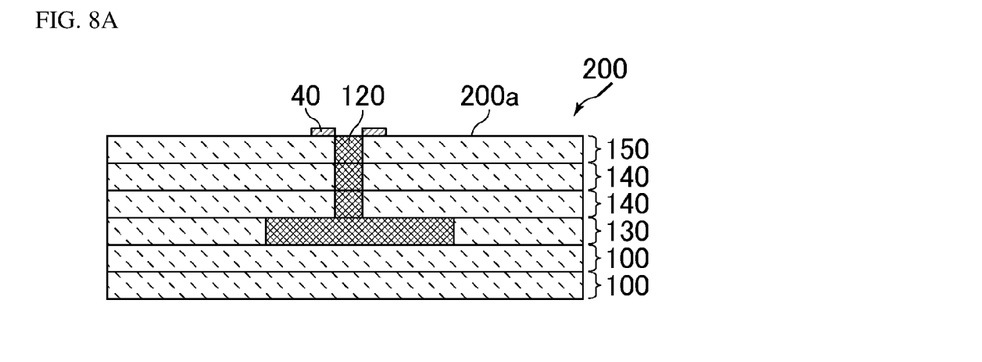
FIG. 8A, FIG. 8B, FIG. 8C, and FIG. 8D are process drawings schematically illustrating example steps to be carried out after a laminating step in a method of manufacturing the multilayer ceramic substrate.

FIG. 8A illustrates a multilayer body 200. The multilayer body 200 is formed by laminating, from the bottom to the top, two ceramic green sheets 100 having no cavity forming material, one lateral-cavity forming green sheet 130, two communication-hole forming green sheets 140, and one principal-surface forming green sheet 150.

Moreover, the lateral-cavity forming green sheet 130, the communication-hole forming green sheets 140, and the principal-surface forming green sheet 150 are laminated such that the respective portions filled with the cavity forming material 120 are connected to each other in the thickness direction.

The land 40 is disposed on a principal surface 200a of the multilayer body 200 at a position to which the cavity forming material 120 reaches.

Next, the firing step is carried out, in which the unsintered ceramic material is sintered by firing the multilayer body and the cavity forming material is burnt out to form a cavity that reaches to the principal surface of the multilayer ceramic substrate.

The firing step can be carried out by using a kiln, such as a batch furnace or a belt furnace.

In the case of the conductive paste being a copper-based paste, the firing is carried out preferably under a reducing atmosphere.

The firing temperature in the firing step is not specifically limited here but may be generally preferably 800° C. or more and 1000° C. or less.

In the firing step, the lateral cavity that stretches in a direction parallel to the principal surfaces can be formed inside the multilayer ceramic substrate by burning out the cavity forming material of the lateral-cavity forming green sheet. The communication hole that extends from the lateral cavity to a principal surface can be also formed in the multilayer ceramic substrate by burning out the cavity forming material of the communication-hole forming green sheets and of the principal-surface forming green sheet.

Figure 8B:
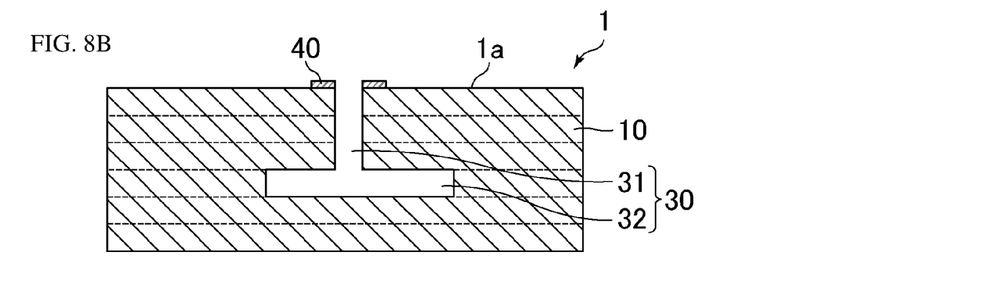

FIG. 8B illustrates the multilayer ceramic substrate 1 obtained after the firing step.

The ceramic layers 10 are formed by sintering the ceramic material during firing. The cavity 30 constituted by the lateral cavity 32 and the communication hole 31 is formed by burning out the cavity forming material. Thus, the cavity 30 reaches to the principal surface 1a of the multilayer ceramic substrate 1 and forms the opening.

If necessary, plating may be performed after the firing step. In this case, for example, Ni—Sn plating or electroless Au plating can be used.

The opening of the cavity may be masked to prevent the plating solution from entering the cavity.

Subsequently, the sealing step is carried out to seal the opening with the sealing member. In the sealing step, it is preferable that the opening be covered with the sealing member by disposing the solder as the sealing member on the land.

It is preferable that the solder as the sealing member be applied onto the land by printing simultaneously when the solder is applied by printing to lands to be used for mounting a component.

A typical solder paste can be used as the solder.

Figure 8C:
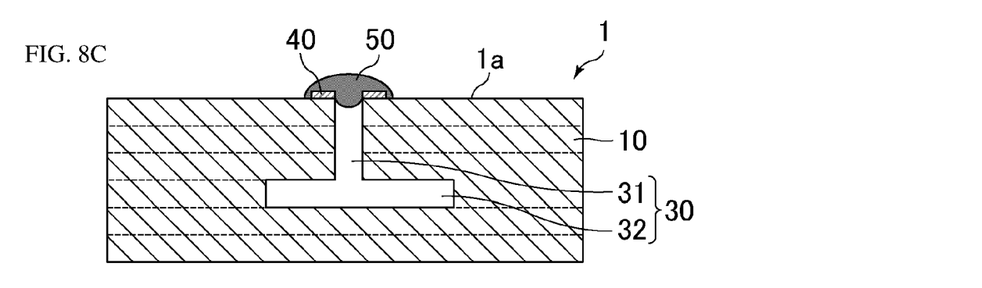

FIG. 8C illustrates the multilayer ceramic substrate 1 in which the cavity 30 is covered with the solder that serves as the sealing member 50.

Subsequently, the electronic component is mounted on the multilayer ceramic substrate 1, and the multilayer ceramic substrate 1 is subjected to reflow treatment. In the reflow treatment, the solder as the sealing member melts and solidifies, thereby sealing the cavity.

If necessary, a mold-covering step is carried out, whereby the principal surface of the multilayer ceramic substrate to which the cavity reaches is covered with the resin mold.

The resin mold may be made of a typical mold material, such as a resin composite containing epoxy resin and silica filler.

Figure 8D:
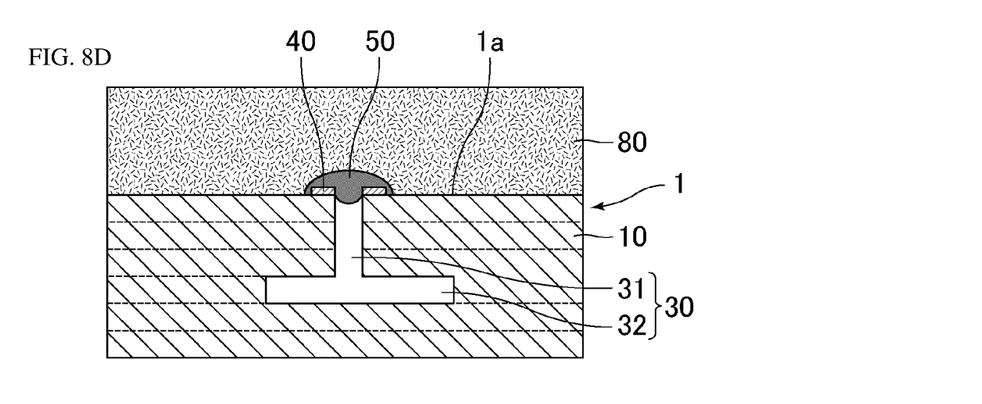

FIG. 8D illustrates an example in which the principal surface 1a of the multilayer ceramic substrate 1 is covered with the resin mold 80.

The multilayer ceramic substrate according to the present disclosure is produced through the above steps.

In the above description, the lateral-cavity forming green sheet is prepared in the following manner: the holes each having a size smaller than the cavity forming hole are formed contiguously in the ceramic green sheet in such a manner that the center of a new hole is shifted slightly from the center of a previous hole while the new hole partially overlaps the previous hole, and subsequently the holes are filled with the cavity forming material. The lateral-cavity forming green sheet, however, can be prepared using an alternative method as described below.

In this alternative method, the lateral-cavity forming green sheet is prepared in the following manner: a laterally expanded hole is formed as the cavity forming hole in a single ceramic green sheet and a cavity forming sheet is disposed at the laterally expanded hole.

Figure 9A:
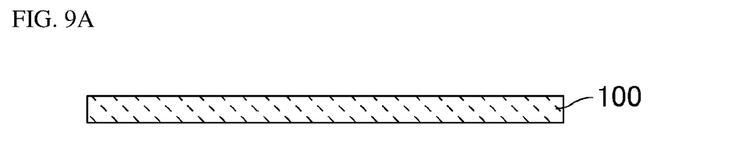
FIG. 9A, FIG. 9B, and FIG. 9C are process drawings schematically illustrating another example process of preparing a lateral-cavity forming green sheet.
Figure 9B:
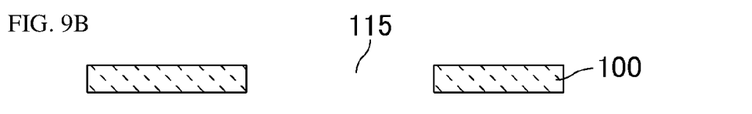
Figure 9C:
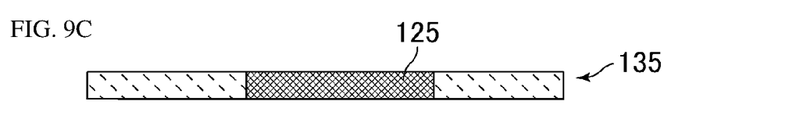

FIGS. 9A, 9B, and 9C are process drawings schematically illustrating another example process of preparing the lateral-cavity forming green sheet.

FIG. 9A illustrates a ceramic green sheet 100. This sheet can be the same as the ceramic green sheet 100 of FIG. 6A.

A via may be formed in the ceramic green sheet 100 to serve as a conductor in the thickness direction.

FIG. 9B illustrates a state of the ceramic green sheet 100 in which a laterally expanded hole 115 is made. The laterally expanded hole 115 is the cavity forming hole disposed and sized so as to be able to form the lateral cavity of a predetermined size.

For example, the laterally expanded hole can be formed in the ceramic green sheet by trepanning by using laser (to cut a circumferential portion) and removing the central portion or can be formed by punching.

A cavity forming sheet is disposed at the laterally expanded hole.

The cavity forming sheet is a sheet of a cavity forming material having a size and a thickness to fit the laterally expanded hole.

A carbon sheet is preferably used as the cavity forming sheet.

The carbon sheet can be obtained in such a manner that a carbon material is pulverized and mixed with an organic binder, a dispersant, and a plasticizer to prepare a slurry, the slurry is applied to a film substrate using a doctor blade to prepare a sheet, and the sheet is dried. A commercially available carbon sheet (graphite sheet) can be also used.

FIG. 9C illustrates a lateral-cavity forming green sheet 135 prepared by disposing a cavity forming sheet 125 at the laterally expanded hole 115.

The lateral-cavity forming green sheet 135 obtained in this way can be used to form the lateral cavity by carrying out the laminating step and the firing step for burning out the cavity forming sheet as is the case for the lateral-cavity forming green sheet 130 described previously.

In other words, by using the lateral-cavity forming green sheet 135, the lateral cavity extending parallel to the principal surfaces of the multilayer ceramic substrate can be formed, and the multilayer ceramic substrate according to the present disclosure can be manufactured.

In addition, the above lateral-cavity forming green sheet can be prepared by using a known printing technique, such as screen printing or ink jet printing, whereby a cavity forming material, such as a resin paste or a carbon paste, is applied onto a portion to be formed into the cavity.

Next, another method of manufacturing the multilayer ceramic substrate according to the present disclosure will be described by taking a case of manufacturing the multilayer ceramic substrate according to the second embodiment as an example.

The multilayer ceramic substrate according to the second embodiment of the present disclosure is different from the multilayer ceramic substrate according to the first embodiment in that the land formed around the cavity has a different configuration. This difference is resulted from a difference in the configuration of the principal-surface forming green sheet and also from a difference in the manufacturing method. Accordingly, the following description focuses on a method of manufacturing this principal-surface forming green sheet.

In the present embodiment, the principal-surface forming green sheet is prepared in the following manner. In the step of forming the cavity forming hole in a ceramic green sheet, a hole having a diameter larger than the predetermined diameter of the cavity to be formed for the multilayer ceramic substrate is first formed in the ceramic green sheet. A via conductor is subsequently filled in this larger-diameter hole. Next, another hole having the same diameter as that of the cavity to be formed for the multilayer ceramic substrate is formed at the center of the via conductor that has been filled in the larger-diameter hole. The same diameter hole is further filled with the cavity forming material.

FIGS. 10A, 10B, 10C, and 10D are process drawings schematically illustrating the alternative example process of preparing the principal-surface forming green sheet.

Figure 10A:
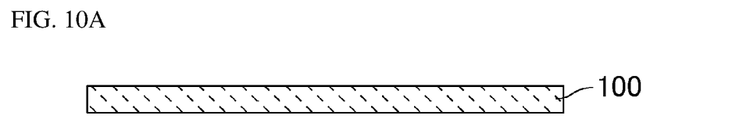
FIG. 10A, FIG. 10B, FIG. 10C, and FIG. 10D are process drawings schematically illustrating another example process of preparing the principal-surface forming green sheet.

FIG. 10A illustrates a ceramic green sheet 100. This sheet can be the same as the ceramic green sheet 100 of FIG. 6A.

A via may be formed in the ceramic green sheet 100 to serve as a conductor in the thickness direction.

Figure 10B:
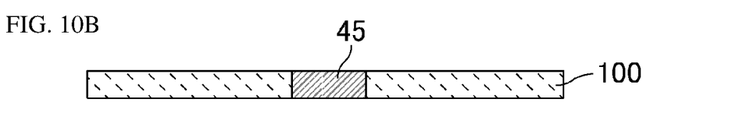

FIG. 10B illustrates a state in which a hole having a diameter larger than that of the cavity to be formed for the multilayer ceramic substrate is formed in the ceramic green sheet 100, and the larger-diameter hole is filled with the via conductor 45.

The larger-diameter hole can be made, for example, by punching or by using a $CO_2$ laser or a UV laser. The diameter of the larger-diameter hole is preferably 250 μm or more and 400 μm or less.

Installation of the via conductor can be done by using the conductive paste that can be used to print conductor patterns.

Figure 10C:
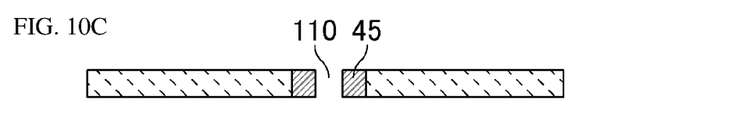

FIG. 10C illustrates a state in which a hole 110 having the same diameter as that of the cavity to be formed for the multilayer ceramic substrate is formed at the center of the via conductor 45 that has been filled in the larger-diameter hole.

The hole 110 is regarded as the cavity forming hole. The hole can be made, for example, by punching or by using a $CO_2$ laser or a UV laser. The diameter of the hole is preferably 20 μm or more and 200 μm or less.

Figure 10D:
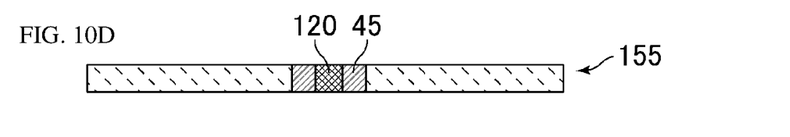

FIG. 10D illustrates a principal-surface forming green sheet 155 prepared by filling the cavity forming hole 110 with the cavity forming material 120.

The cavity forming material can be the same as the material used in the preparation of the lateral-cavity forming green sheet 130.

In the principal-surface forming green sheet 155 obtained as described above, the via conductor 45 is disposed around the cavity forming material 120.

The laminating step and the firing step are carried out to produce a multilayer body by laminating the principal-surface forming green sheet obtained in the above step onto the other types of ceramic green sheets.

The procedures of the laminating step and the firing step are the same as those for manufacturing the multilayer ceramic substrate according to the first embodiment of the present disclosure except for using a different type of principal-surface forming green sheet.

Figure 11A:
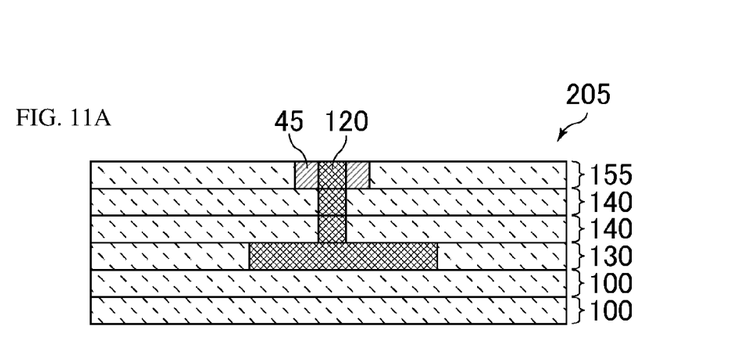
FIG. 11A, FIG. 11B, and FIG. 11C are process drawings schematically illustrating other example steps to be carried out after the laminating step in the method of manufacturing the multilayer ceramic substrate.
Figure 11B:
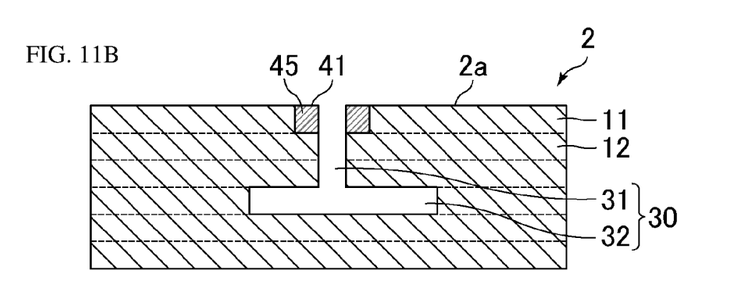
Figure 11C:
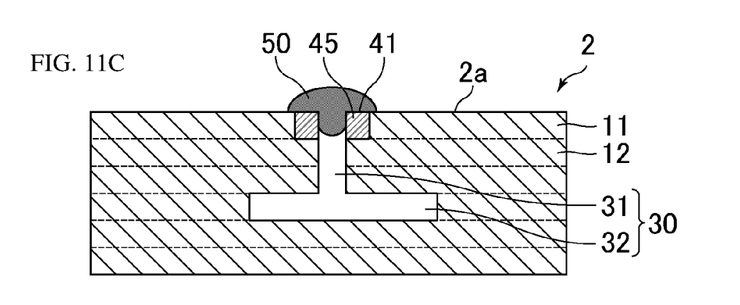

FIGS. 11A, 11B, and 11C are process drawings schematically illustrating other example steps to be carried out after the laminating step in the method of manufacturing the multilayer ceramic substrate.

FIG. 11A illustrates a multilayer body 205. The multilayer body 205 is formed by laminating, from the bottom to the top, two ceramic green sheets 100 having no cavity forming material, one lateral-cavity forming green sheet 130, two communication-hole forming green sheets 140, and one principal-surface forming green sheet 155.

Moreover, the lateral-cavity forming green sheet 130, the communication-hole forming green sheets 140, and the principal-surface forming green sheet 155 are laminated such that the respective portions filled with the cavity forming material 120 are connected to each other in the thickness direction.

FIG. 11B illustrates the multilayer ceramic substrate 2 obtained after the firing step.

The ceramic layer 11 and ceramic layers 12 are formed by sintering the ceramic material during firing. The cavity 30 constituted by the lateral cavity 32 and the communication hole 31 is formed by burning out the cavity forming material. Thus, the cavity 30 reaches to the principal surface 2a of the multilayer ceramic substrate 2.

The surface of the via conductor 45 serves as the land 41 at the principal surface 2a of the multilayer ceramic substrate 2, and the inside wall of the via conductor 45 serves as the inside wall of the cavity 30.

FIG. 11C illustrates the multilayer ceramic substrate 2 obtained by disposing the solder as the sealing member 50 on the land 41 (on the surface of the via conductor 45) and by covering the cavity 30 with the sealing member 50. In the multilayer ceramic substrate 2, the sealing member 50 is also present on the inside wall of the via conductor 45.

The multilayer ceramic substrate according to the present disclosure can be manufactured also by using the above-described method.

1, 2, 3 multilayer ceramic substrate
1a, 1b, 2a, 2b, 3a, 3b principal surface of multilayer ceramic substrate
10, 11, 12 ceramic layer
20 patterned conductor
21 signal line
22 ground
23 patterned conductor (via)
30, 30a, 30b cavity
31 communication hole
32 lateral cavity
40, 40a, 40b, 40c, 40d, 41 land 45 via conductor
50 sealing member
60 electronic component
80 resin mold
100 ceramic green sheet
110 cavity forming hole
115 laterally expanded hole
120 cavity forming material
125 cavity forming sheet
130, 135 lateral-cavity forming green sheet
140 communication-hole forming green sheet
150, 155 principal-surface forming green sheet
200, 205 multilayer body
200a principal surface of multilayer body

The invention claimed is:

1. A multilayer ceramic substrate having a cavity provided, the multilayer ceramic substrate comprising: ceramic layers; and a plurality of patterned conductors, wherein the cavity reaches a principal surface of the multilayer ceramic substrate to provide an opening, and the opening is covered with a sealing member at the principal surface of the multilayer ceramic substrate, in a thickness direction of the multilayer ceramic substrate, the cavity is positioned between the patterned conductors opposite to each other, and at least one of the patterned conductors opposite to each other is embedded inside the ceramic layers without being exposed from the ceramic layers; wherein a land is provided at a position around the opening, and solder serving as the sealing member is disposed on the land; the cavity is comprised of a lateral cavity and a communication hole, the lateral cavity stretches inside the multilayer ceramic substrate in a direction parallel to the principal surface of the multilayer ceramic substrate and the communication hole extends from the lateral cavity toward the principal surface of the multilayer ceramic substrate so as to reach the principal surface.

2. The multilayer ceramic substrate according to claim 1, wherein the land is disposed so as to surround an entire circumference of the opening.

3. The multilayer ceramic substrate according to claim 1, wherein the land is a surface portion of a via conductor provided inside a ceramic layer serving as the principal surface of the multilayer ceramic substrate, and the solder is also present on an inside wall of the via conductor.

4. The multilayer ceramic substrate according to claim 1, wherein an outside diameter of the land is larger by 50 um or more than an outside diameter of the opening.

5. The multilayer ceramic substrate according to claim 1, wherein an outside diameter of the opening is 20 μm or more and 200 μm or less.

6. The multilayer ceramic substrate according to claim 1, wherein the principal surface of the multilayer ceramic substrate is covered with a resin mold.

7. The multilayer ceramic substrate according to claim 2, wherein
   the land is a surface portion of a via conductor provided inside a ceramic layer serving as the principal surface of the multilayer ceramic substrate, and
   the solder is also present on an inside wall of the via conductor.

8. The multilayer ceramic substrate according to claim 2, wherein
   an outside diameter of the land is larger by 50 μm or more than an outside diameter of the opening.

9. The multilayer ceramic substrate according to claim 3, wherein
   an outside diameter of the land is larger by 50 μm or more than an outside diameter of the opening.

* * * * *